(12) United States Patent
Kan

(10) Patent No.: US 7,471,151 B2
(45) Date of Patent: Dec. 30, 2008

(54) CIRCUITS FOR QUIESCENT CURRENT CONTROL

(75) Inventor: Meng-Ping Kan, Chutung Town (TW)

(73) Assignee: Trendchip Technologies Corp., Chutung, Hsinchu (TW)

( * ) Notice: Subject to any disclaimer, the term of this patent is extended or adjusted under 35 U.S.C. 154(b) by 70 days.

(21) Appl. No.: 11/748,346

(22) Filed: May 14, 2007

(65) Prior Publication Data

US 2008/0284515 A1 Nov. 20, 2008

(51) Int. Cl.
*H03F 3/18* (2006.01)
(52) U.S. Cl. ........................... 330/264; 330/269
(58) Field of Classification Search ............... 330/255, 330/264, 269
See application file for complete search history.

(56) References Cited

U.S. PATENT DOCUMENTS 4,356,453 A * 10/1982 Sueyoshi .................. 330/277
4,963,837 A * 10/1990 Dedic ....................... 330/264
5,621,357 A * 4/1997 Botti et al. ................ 330/253
6,255,909 B1 * 7/2001 Muza ....................... 330/264

* cited by examiner

*Primary Examiner*—Henry K Choe
(74) *Attorney, Agent, or Firm*—Alston & Bird LLP

(57) ABSTRACT

A circuit capable of quiescent current control, the circuit comprising a first operational transconductance amplifier (OTA) including a first output terminal, a first transistor including a first gate coupled to the first output terminal of the first OTA, a second OTA including a second output terminal, a second transistor including a second gate coupled to the second output terminal of the second OTA, a resistive load including a first terminal coupled to the first output terminal and the first gate, and a second terminal coupled to the second terminal and the second gate, a first current source capable of providing a first current flowing toward the first terminal of the resistive load, and a second current source capable of providing a second current flowing away from the second terminal of the resistive load.

30 Claims, 4 Drawing Sheets

CIRCUITS FOR QUIESCENT CURRENT CONTROL

BACKGROUND OF THE INVENTION

The present invention relates generally to electronic circuits, and more particularly, to circuits capable of controlling a quiescent current in a communication device.

Line drivers have been generally used in communication systems such as digital subscriber line (DSL) systems, for example, for delivering signal power to a remote terminal over a twisted-pair line. For example in association with a modem at an asymmetric digital subscriber line (ADSL) customer-premises equipment (CPE) side, a line driver may be used to deliver signal power of approximately 13 dbm (decibel milliwatt) over the line within a frequency band in the range of 20 KHz (Hertz) to 300 KHz. Furthermore, the line driver may be required to process signals of relatively high peak power with minimum distortion so as to meet the bit error ratio (BER) requirements in a DSL system.

To support high-power, high-frequency applications, such as in a DSL communication system, a p-type metal-oxide-semiconductor (PMOS) transistor and an n-type metal-oxide-semiconductor (NMOS) transistor may be used to serve as a push-pull output stage in a communication circuit. The push-pull transistor pair, in particular the PMOS transistor due to its relatively low mobility, may have a relatively large size in order to drive a low resistive load. Such a large size may disadvantageously result in large parasitic capacitive loads between the push-pull transistor pair and a previous stage such as a pre-drive stage. In some applications, such as high speed line drivers in communication circuits where a large output swing in frequency over several mega Hertz may be needed, a peak current through the parasitic capacitive load can reach several milliamperes (mA). Therefore, a pair of operational transconductance amplifiers (OTAs) with good current driving capability may be employed to drive the output-stage PMOS and NMOS transistors, respectively. The use of a pair of OTAs in a pre-drive stage has been discussed in a paper entitled "A High Performance CMOS Power Amplifier" by J. A Fisher, IEEE J. Solid-State Circuits, vol. SC-20, pp. 70-75, December 1985. An issue with such an OTA-pair circuit structure may lie in that quiescent current becomes hard to control. Various studies have tried to resolve the issue of quiescent current control. An example may be found in "A CMOS Line Driver for ADSL Central Office Applications" by A. Bicakci et al., IEEE J. Solid-State Circuits, pp. 2201-2208, December 2003, in which an additional digital-to-analog converter (DAC) is used for offset calibration.

FIG. 1 is a schematic diagram of a circuit 10 including an offset calibration device. Referring to FIG. 1, the circuit 10 may include an input stage, a pre-drive stage, an output stage and an offset calibration device 13. The input stage may include an operational transconductance amplifier (OTA) 11, which receives an input voltage signal Vin at a positive or non-inverting terminal and provides an output voltage signal Vip2 at another positive terminal. The pre-drive stage may include a first OTA 12-1 and a second OTA 12-2, each of which includes a positive terminal coupled with the output Vip2. The output stage may include a PMOS transistor labeled MP and an NMOS transistor labeled MN, which together form a push-pull pair. The PMOS transistor MP includes a gate terminal coupled to a negative or inverting terminal of the first OTA 12-1 and biased at a voltage Vgp from the negative terminal. The NMOS transistor MN includes a gate terminal coupled to a negative terminal of the second OTA 12-2 and biased at a voltage Vgn from the negative terminal. The offset calibration device 13, based on the voltages Vgp and Vgn, may provide a feedback voltage to the positive terminals of the first OTA 12-1 and the second OTA 12-2 for offset calibration. In operation, an output voltage Vout of the output stage increases as Vgp or Vgn decreases, and decreases as Vgp or Vgn increases. However, the circuit 10 may lose control of quiescent current if the voltages Vgp and Vgn, which are independent of one another, go in opposite directions. For example, Vgp may go up toward a power rail voltage while Vgn may go down toward a ground voltage, or vice versa, depending on the offsets inside the OTAs 12-1 and 12-2. With the increasing demands for higher data rate and wider bandwidth, the circuit 10 may be not suitable for high-power and high-frequency applications and may not meet the requirements for relatively high linearity in, for example, a very high data rate DSL (VDSL) communication system.

It may be desirable to have a circuit that is able to address the issue of quiescent current control in a communication device. It may also be desirable to have a circuit that is able to provide a robust quiescent current control without interfering with the operation of a pre-drive stage.

BRIEF SUMMARY OF THE INVENTION

Examples of the present invention may provide a circuit capable of quiescent current control, the circuit comprising a first operational transconductance amplifier (OTA) including a first output terminal, a first transistor including a first gate coupled to the first output terminal of the first OTA, a second OTA including a second output terminal, a second transistor including a second gate coupled to the second output terminal of the second OTA, a resistive load including a first terminal coupled to the first output terminal and the first gate, and a second terminal coupled to the second terminal and the second gate, a first current source capable of providing a first current flowing toward the first terminal of the resistive load, and a second current source capable of providing a second current flowing away from the second terminal of the resistive load.

Some examples of the present invention may also provide a circuit capable of quiescent current control, the circuit comprising a pair of transistors capable of providing an output voltage, each of the pair of transistors including a gate terminal, a pair of operational amplifiers capable of driving the pair of transistors, and a control circuit including a pair of current sources and a resistive load between the pair of current sources, wherein a voltage across the gate terminals of the pair of transistors is a function of an offset current flowing from at least one operational amplifier of the pair of operational amplifiers through the resistive load.

Examples of the present invention may further provide a circuit capable of quiescent current control, the circuit comprising a first operational transconductance amplifier (OTA) including a first output terminal, a second OTA including a second output terminal, a resistive load including a first terminal coupled to the first output terminal of the first OTA, and a second terminal coupled to the second terminal of the second OTA, a first current source capable of providing a first current flowing toward the first terminal of the resistive load, and a second current source capable of providing a second current flowing away from the second terminal of the resistive load, wherein a voltage across the first terminal and the second terminal of the resistive load is a function of an offset current flowing from at least one of the first OTA and the second OTA through the resistive load.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Reference will now be made in detail to the present embodiments of the invention, examples of which are illustrated in the accompanying drawings. Wherever possible, the same reference numbers will be used throughout the drawings to refer to the same or like parts.

Figure 1:
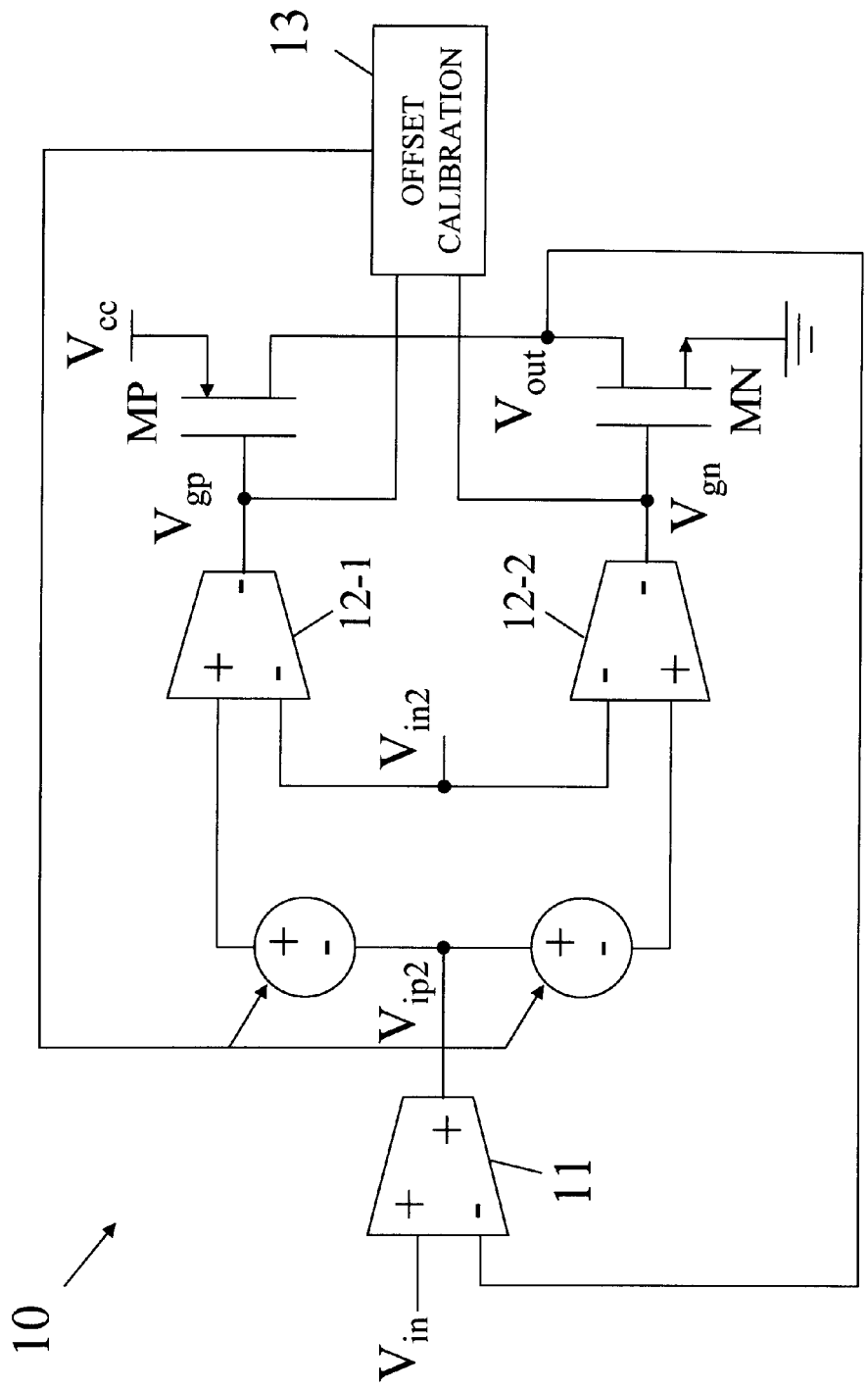
FIG. 1 is a schematic diagram of a circuit including an offset calibration device.
Figure 2:
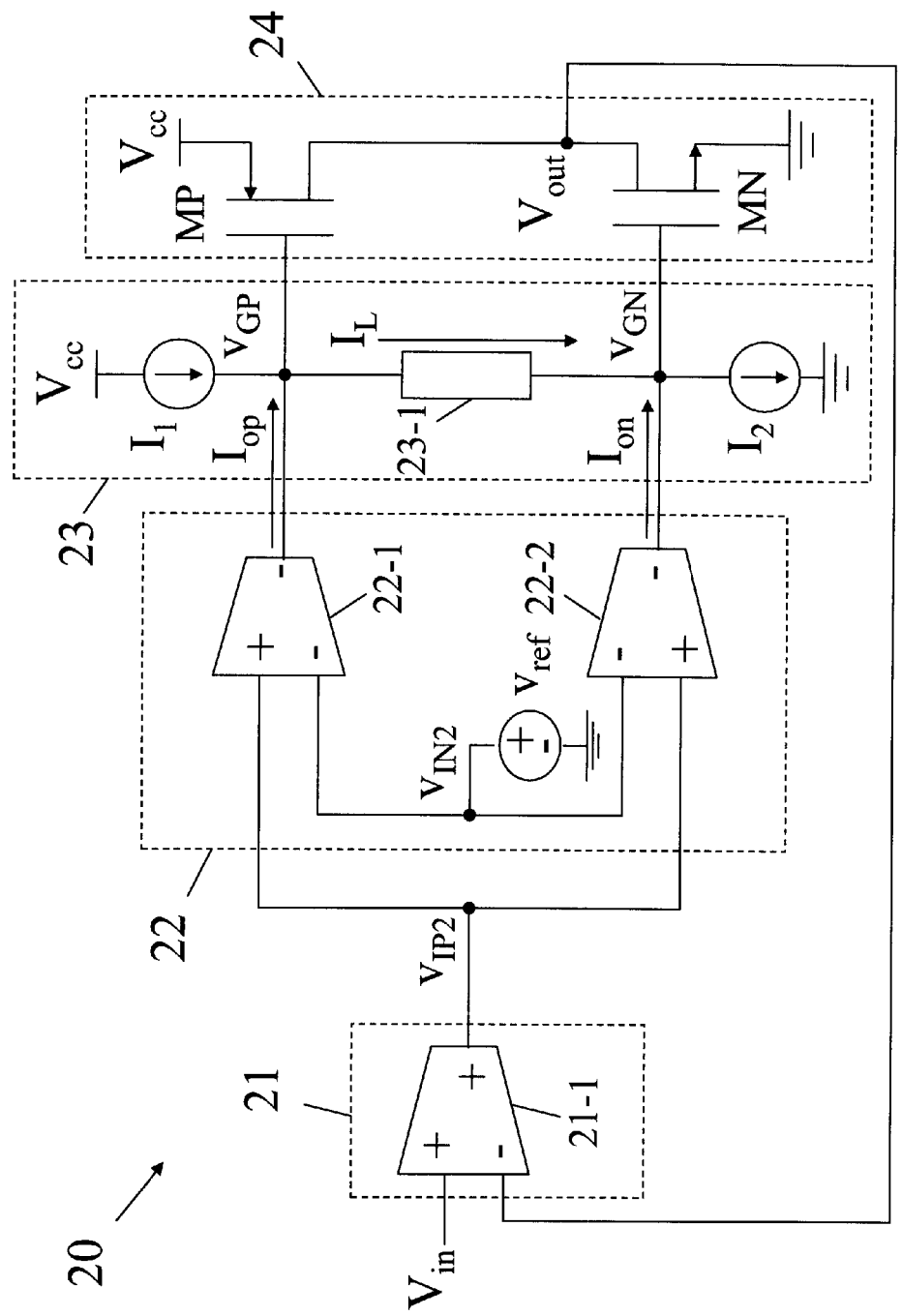
FIG. 2 is a diagram of a circuit for quiescent current control in accordance with an example of the present invention.

FIG. 2 is a diagram of a circuit 20 for quiescent current control in accordance with an example of the present invention. Referring to FIG. 2, the circuit 20 may include an input stage 21, a pre-drive stage 22, a quiescent current control circuit 23 and an output stage 24. The input stage 21 may include an operational transconductance amplifier (OTA) 21-1, which receives an input voltage signal $V_{in}$ at a positive or non-inverting input terminal and provides an output voltage $V_{IP2}$ at a positive output terminal. The pre-drive stage 22 may include a first OTA 22-1 and a second OTA 22-2. In one example, each of the first OTA 22-1 and the second OTA 22-2 may include a class AB operational amplifier fabricated in complementary metal-oxide-semiconductor (CMOS) processes. The first OTA 22-1 may include a positive input terminal coupled to the output of the OTA 21-1, a negative or inverting input terminal coupled to a reference voltage Vref, and a negative output terminal. The second OTA 22-2 may include a positive input terminal coupled to the output of the OTA 21-1, a negative input terminal coupled to the reference voltage Vref, and a negative output terminal. The quiescent current control circuit 23 may include a first current source labeled $I_1$, a second current source labeled $I_2$, and a resistive load 23-1 between the first current source $I_1$ and the second current source $I_2$. The resistive load 23-1 may include one of a resistor and a transistor, which may provide a resistance of, for example, $R_L$. The resistive load 23-1 further includes a first terminal coupled to the output terminal of the first OTA 22-1, and a second terminal coupled to the output terminal of the second OTA 22-2. The first current source $I_1$, which may provide a current having a magnitude of $I_L$, is coupled between a voltage rail Vcc and the first terminal of the resistive load 23-1 and the second current source $I_2$, which may provide a current having a magnitude of $I_L$, is coupled between the second terminal of the resistive load 23-1 and a ground rail.

The output stage 24 may include a PMOS transistor MP and an NMOS transistor MN. The PMOS transistor MP may include a gate coupled to the output terminal of the first OTA 22-1 and the first terminal of the resistive load 23-1, a source terminal coupled to the power rail Vcc, and a drain terminal. The NMOS transistor MN may include a gate coupled to the output terminal of the second OTA 22-2 and the second terminal of the resistive load 23-1, a source terminal coupled to the ground rail, and a drain terminal coupled to the drain terminal of the PMOS transistor MP. The output stage 24 provides an output voltage $V_{out}$ at the drain terminals, which is fed back to a negative terminal of the OTA 21-1.

In direct-current (DC)-mode operation, i.e., when no alternating-current (AC) signals present at the input, the output voltage $V_{IP2}$ equals a voltage $V_{IN2}$ at a node between the negative input terminals of the OTAs 22-1 and 22-2 due to closed-loop operation, no matter what reference voltage level the node is coupled to. The reference voltage $V_{ref}$ in one example may equal a commode mode voltage level, or half the value of Vcc. Assuming that the OTAs 22-1 and 22-2 are ideal or substantially ideal amplifiers so that offset currents $I_{op}$ and $I_{on}$ respectively from the OTAs 22-1 and 22-2 may equal zero or may be neglected, the voltage difference between $V_{GP}$ and $V_{GN}$, which are the voltages at the gates of the PMOS and NMOS transistors, respectively, may be largely determined by the equation given below.

$$V_{GP} - V_{GN} = I_L \times R_L$$

However, since each of the OTAs 22-1 and 22-2 may include differential amplifiers, mismatch in the OTAs 22-1 and 22-2 may occur, resulting in a significant offset current. As a result, the voltage difference between $V_{GP}$ and $V_{GN}$ may be expressed by the equation given below.

$$V_{GP} - V_{GN} = I_L \times R_L + (I_{op} - I_{on}) \times R_L$$

The voltage difference between the gate voltages of the PMOS and NMOS transistors may thereby be clamped. That is, the issue that quiescent current may be out of control due to gate voltages going in opposite directions may be addressed. The resistance value of $R_L$ may be relatively small so as to alleviate the offset effects caused by the term $(I_{op} - I_{on}) \times R_L$. In one example, the resistance value of $R_L$ may be several kilo-ohms. Furthermore, once the value of $R_L$ is determined, the value of $I_L$ may be determined by the equation given below.

$$I_L \times R_L = Vcc - |V_{THP}| - V_{THN}$$

Where $V_{THP}$ and $V_{THN}$ are the threshold voltages of the PMOS and NMOS transistors, respectively.

In AC-mode operation, i.e., when AC signals present at the input, since the OTAs 22-1 and 22-2 in one example may be designed with substantially the same AC response, signals at the nodes $V_{GP}$ and $V_{GN}$ may equal one another in phase and magnitude. As a result, the resistive load 23-1 may no longer form an AC load with respect to the first OTA 22-1 and the second OTA 22-2. Hence, a relatively high AC gain may be achieved, irrespective of the value of $R_L$.

Figure 3:
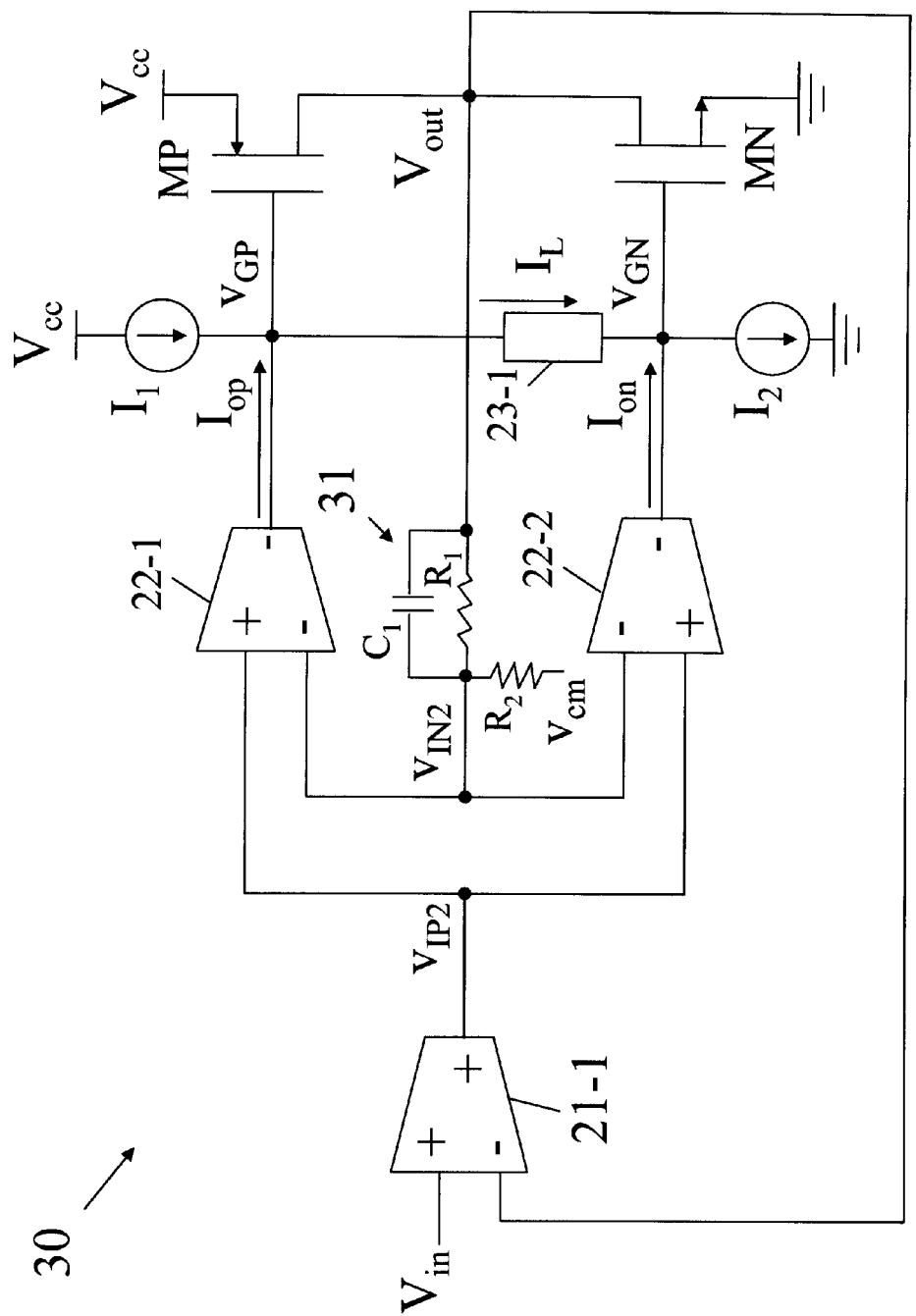
FIG. 3 is a diagram of a circuit for quiescent current control in accordance with another example of the present invention.

FIG. 3 is a diagram of a circuit 30 for quiescent current control in accordance with another example of the present invention. Referring to FIG. 3, the circuit 30 may be similar to the circuit 20 illustrated in FIG. 2 except that, for example, a feedback network 31 is added. The feedback network 31 may include a capacitor $C_1$ and a first resistor $R_1$ connected in parallel with one another, and a second resistor $R_2$ coupled between a first terminal of the first resistor $R_1$ and a commode mode voltage $V_{cm}$. A second terminal of the first resistor $R_1$ is coupled to the output node $V_{out}$. The feedback network 31 may function to provide phase-lead compensation and may achieve bandwidth expansion.

Figure 4:
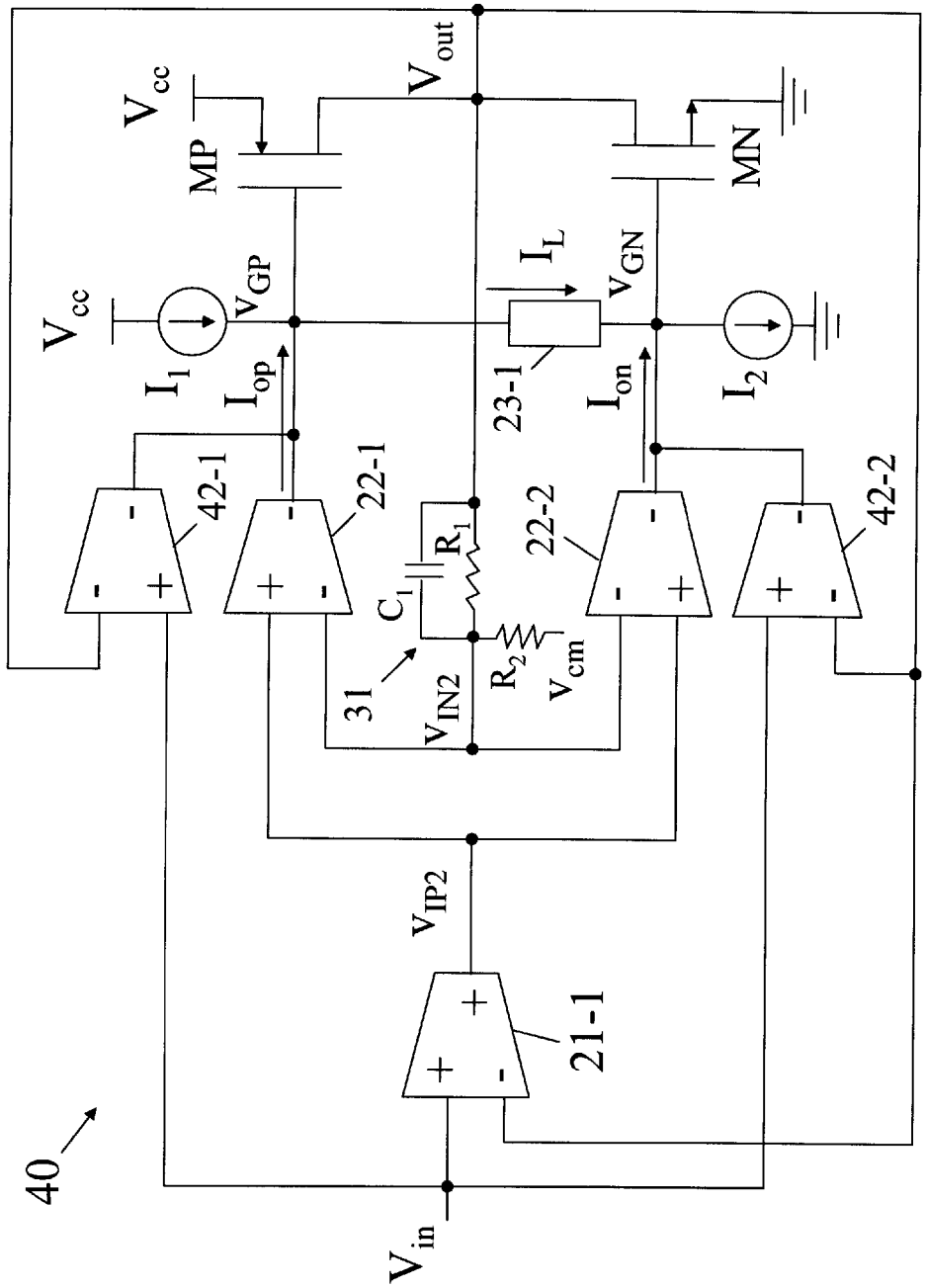
FIG. 4 is a diagram of a circuit for quiescent current control in accordance with still another example of the present invention.

FIG. 4 is a diagram of a circuit 40 for quiescent current control in accordance with still another example of the present invention. Referring to FIG. 4, the circuit 40 may be similar to the circuit 30 illustrated in FIG. 3 except that, for example, a third OTA 42-1 and a fourth OTA 42-2 are added. The third OTA 42-1 may include a positive input terminal coupled to $V_{in}$, a negative input terminal coupled to $V_{out}$, and a negative output terminal coupled to the negative output terminal of the first OTA 22-1. The fourth OTA 42-2 may include a positive input terminal coupled to $V_{in}$, a negative input terminal coupled to $V_{out}$, and a negative output terminal coupled to the negative output terminal of the second OTA 22-2. The first, second, third and fourth OTAs 22-1, 22-2, 42-1 and 42-2 may together form a pre-drive stage of the circuit 40. In one example, the third and fourth OTAs 42-1 and 42-2 may operate at a higher speed than the first and second OTAs 22-1 and 22-2. The circuit 40 may be advantageous in that a phase delay from the total gain stages may be alleviated, which may result in an improved bandwidth.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

I claim:

1. A circuit capable of quiescent current control, the circuit comprising:
    a first operational transconductance amplifier (OTA) including a first output terminal;
    a first transistor including a first gate coupled to the first output terminal of the first OTA;
    a second OTA including a second output terminal;
    a second transistor including a second gate coupled to the second output terminal of the second OTA;
    a resistive load including a first terminal coupled to the first output terminal and the first gate, and a second terminal coupled to the second terminal and the second gate;
    a first current source capable of providing a first current flowing toward the first terminal of the resistive load; and
    a second current source capable of providing a second current flowing away from the second terminal of the resistive load.

2. The circuit of claim 1, wherein the resistive load includes one of a resistor and a transistor.

3. The circuit of claim 1, wherein each of the first OTA and the second OTA includes a class AB operational amplifier.

4. The circuit of claim 1, wherein the first transistor includes a p-type metal-oxide-semiconductor (PMOS) transistor, and the second transistor includes an n-type metal-oxide-semiconductor (NMOS) transistor.

5. The circuit of claim 1, wherein a voltage across the first terminal and the second terminal of the resistive load is a function of a first offset current flowing toward the first terminal of the resistive load.

6. The circuit of claim 1, wherein a voltage across the first terminal and the second terminal of the resistive load is a function of a second offset current flowing toward the second terminal of the resistive load.

7. The circuit of claim 1, wherein a voltage across the first terminal and the second terminal of the resistive load is a function of a first offset current flowing toward the first terminal of the resistive load and a second offset current flowing toward the second terminal of the resistive load.

8. The circuit of claim 1, wherein the first OTA includes a first input terminal coupled to a reference voltage source, and the second OTA includes a second input terminal coupled to the first input terminal of the first OTA and the reference voltage source.

9. The circuit of claim 1 further comprising a feedback network coupled with the first transistor and the second transistor, the feedback network comprising:
    a capacitor;
    a first resistor connected in parallel with the capacitor, the first resistor including a first terminal and a second terminal; and
    a second resistor coupled between the first terminal and a commode mode voltage source.

10. The circuit of claim 9, wherein the first terminal of the first resistor is coupled to an inverting input terminal of the first OTA and an inverting input terminal of the second OTA.

11. The circuit of claim 9, wherein the second terminal of the first resistor is coupled to a drain terminal of the first transistor and a drain terminal of the second transistor.

12. The circuit of claim 1 further comprising a third OTA including a third output terminal coupled to the first output terminal of the first OTA.

13. The circuit of claim 1 further comprising a fourth OTA including a fourth output terminal coupled to the second output terminal of the second OTA.

14. A circuit capable of quiescent current control, the circuit comprising:
    a pair of transistors capable of providing an output voltage, each of the pair of transistors including a gate terminal;
    a pair of operational amplifiers capable of driving the pair of transistors; and
    a control circuit including a pair of current sources and a resistive load between the pair of current sources,
    wherein a voltage across the gate terminals of the pair of transistors is a function of an offset current flowing from at least one operational amplifier of the pair of operational amplifiers through the resistive load.

15. The circuit of claim 14, wherein the pair of operational amplifiers includes a first operational transconductance amplifier (OTA) including a first output terminal, and a second OTA including a second output terminal.

16. The circuit of claim 15, wherein the pair of transistors includes a first transistor including a first gate coupled to the first output terminal of the first OTA, and second transistor including a second gate coupled to the second output terminal of the second OTA.

17. The circuit of claim 14, wherein the resistive load includes one of a resistor and a transistor.

18. The circuit of claim 16, wherein the resistive load includes a first terminal coupled to the first output terminal and the first gate, and a second terminal coupled to the second terminal and the second gate.

19. The circuit of claim 18, wherein the pair of current sources includes a first current source capable of providing a first current flowing toward the first terminal of the resistive load.

20. The circuit of claim 18, wherein the pair of current sources includes a second current source capable of providing a second current flowing away from the second terminal of the resistive load.

21. The circuit of claim 18, wherein a voltage across the first terminal and the second terminal of the resistive load is a function of a first offset current flowing toward the first terminal of the resistive load.

22. The circuit of claim 18, wherein a voltage across the first terminal and the second terminal of the resistive load is a function of a second offset current flowing toward the second terminal of the resistive load.

23. The circuit of claim 14 further comprising a feedback network coupled with the first transistor and the second transistor, the feedback network comprising:
 a capacitor;
 a first resistor connected in parallel with the capacitor, the first resistor including a first terminal and a second terminal; and
 a second resistor coupled between the first terminal and a commode mode voltage source.

24. The circuit of claim 15 further comprising a third OTA including a third output terminal coupled to the first output terminal of the first OTA.

25. The circuit of claim 15 further comprising a fourth OTA including a fourth output terminal coupled to the second output terminal of the second OTA.

26. A circuit capable of quiescent current control, the circuit comprising:
 a first operational transconductance amplifier (OTA) including a first output terminal;
 a second OTA including a second output terminal;
 a resistive load including a first terminal coupled to the first output terminal of the first OTA, and a second terminal coupled to the second terminal of the second OTA;
 a first current source capable of providing a first current flowing toward the first terminal of the resistive load; and
 a second current source capable of providing a second current flowing away from the second terminal of the resistive load,
 wherein a voltage across the first terminal and the second terminal of the resistive load is a function of an offset current flowing from at least one of the first OTA and the second OTA through the resistive load.

27. The circuit of claim 26, wherein the resistive load includes one of a resistor and a transistor.

28. The circuit of claim 26 further comprising a PMOS transistor including a gate coupled to the first terminal of the resistive load, and an NMOS transistor including a gate coupled to the second terminal of the resistive load.

29. The circuit of claim 26 further comprising a third OTA including a third output terminal coupled to the first output terminal of the first OTA.

30. The circuit of claim 26 further comprising a fourth OTA including a fourth output terminal coupled to the second output terminal of the second OTA.

* * * * *